United States Patent [19]

Parsonage

[11] Patent Number: 4,651,023

[45] Date of Patent: Mar. 17, 1987

[54] ELECTRONIC SWITCH

[75] Inventor: Peter C. J. Parsonage, Auckland, New Zealand

[73] Assignee: Development Finance Corporation, Auckland, New Zealand

[21] Appl. No.: 739,601

[22] Filed: May 29, 1985

[30] Foreign Application Priority Data

May 29, 1984 [NZ] New Zealand ........................ 208317

[51] Int. Cl.⁴ ................................................ H03F 17/00

[52] U.S. Cl. .................................... 307/117; 307/116; 307/311; 250/551; 250/209; 250/210

[58] Field of Search ............... 307/112, 113, 114, 115, 307/116, 117, 311; 200/61.02, DIG. 36; 250/211 R, 213 R, 213 A, 214 A, 214 AL, 214 SW, 239, 551, 552; 435/808; 340/942, 583, 555, 600; 361/160, 173; 330/59, 308

[56] References Cited

U.S. PATENT DOCUMENTS

| | | | |
|---|---|---|---|
| 3,256,769 | 6/1966 | Matthews et al. | 361/174 |
| 3,431,427 | 3/1969 | Pahl | 250/214 R |
| 3,433,962 | 3/1969 | Neiger | 250/208 X |
| 3,464,773 | 9/1969 | Waz | 307/311 X |
| 3,563,143 | 2/1971 | Peterson | 250/209 X |
| 3,601,614 | 8/1971 | Platzer | 307/311 X |
| 3,621,356 | 9/1969 | On | 250/210 X |
| 3,767,924 | 10/1973 | Charles et al. | 250/209 |
| 3,790,789 | 2/1974 | Takahashi et al. | 250/214 P X |
| 3,803,419 | 4/1974 | Obenhaus | 250/552 X |
| 3,859,648 | 1/1975 | Corbin | 340/555 |
| 3,901,813 | 8/1975 | Potopinski | 250/214 AL X |
| 3,975,643 | 8/1976 | Toth | 250/551 |
| 3,978,343 | 8/1976 | Broderick et al. | 250/551 |
| 4,032,843 | 6/1977 | Loucks | 250/551 X |
| 4,292,551 | 9/1981 | Kolmann | 250/551 X |
| 4,321,487 | 3/1982 | Huykman | 307/311 |
| 4,352,998 | 10/1982 | Baker et al. | 307/311 |

*Primary Examiner*—William M. Shoop, Jr.
*Assistant Examiner*—Shik Luen Paul Ip
*Attorney, Agent, or Firm*—Young & Thompson

[57] ABSTRACT

An electronic switch has a pair of light dependent resistors forming part of a potential divider with the hysteresis of the circuit being high enough to prevent equally applied changes in light level from effecting the switch action. The divider controls the voltage to an operational amplifier which is switched off by covering the other resistor. The switch may be combined with an opto-isolator or a relay to control power circuits.

7 Claims, 1 Drawing Figure

ELECTRONIC SWITCH

Figure 1:
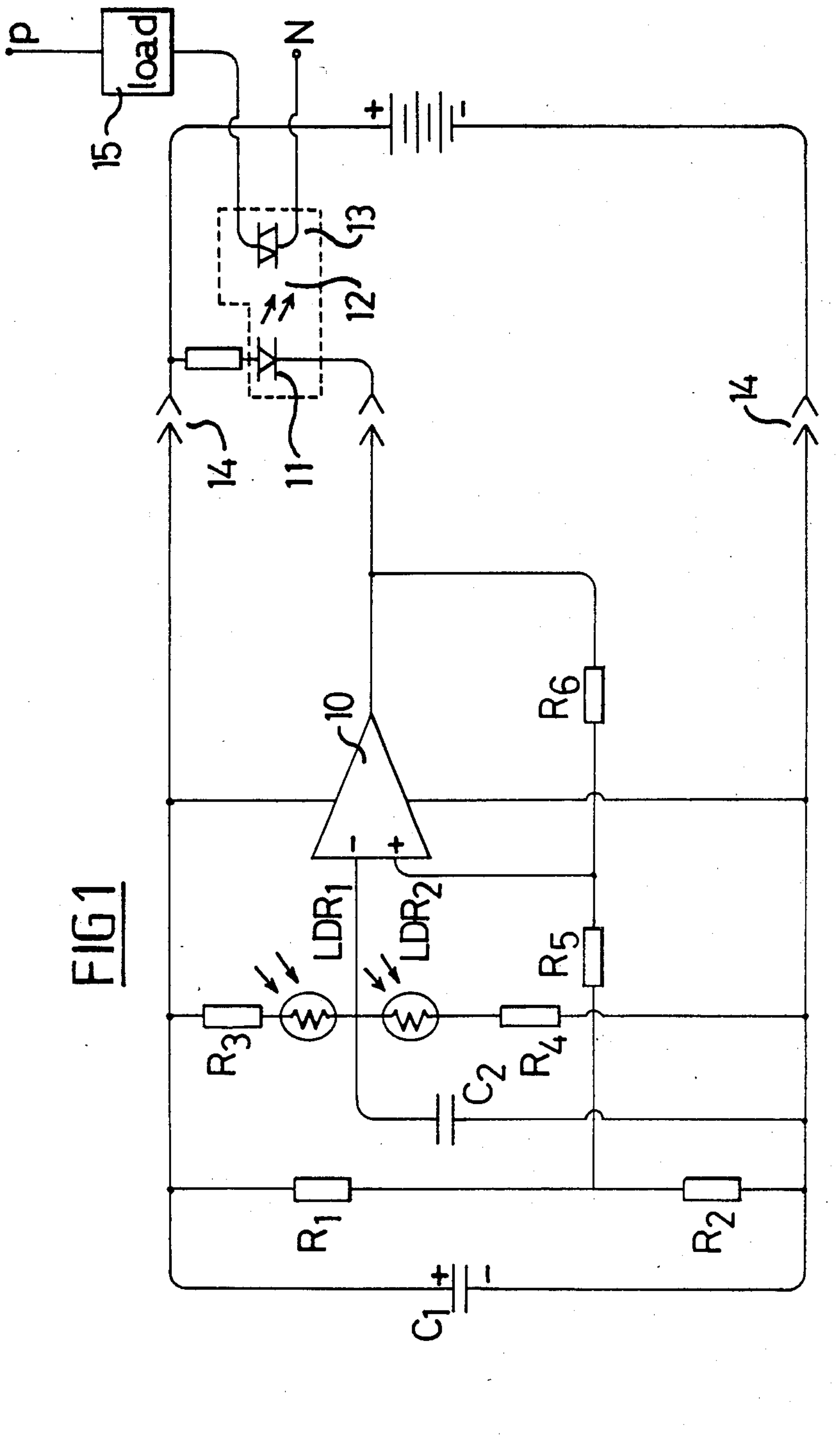

This invention relates to an electronic switch, and has particular application to switches for use outdoors.

There is a need for switches which can be used to control power circuits, out of doors, and in other environments, where moisture or a hazardous environment may interfere with the circuit. For example, there is a need for switches for use with spa pools, swimming pools, and the like which are both waterproof and utilise a low voltage (for safety reasons) to isolate the switch from the power circuit for lights, pumps, etc. Existing switches for spa pools involve the use of contacts operated by change in air pressure, which are expensive and inherently unreliable.

It is an object of this invention to go some way to meeting the above mentioned need, and providing an improved electronic switch, or one which will at least provide the public with a useful choice.

In one aspect, the invention provides a pair of sensing means connected to a switching device, each sensing means capable of triggering the switch means in response to a changing state of that sensing means but not capable of switching the switching device when the change of state is removed or reversed, rather the switching device being triggered in the opposite mode when the other sensing means changes state in the desired direction.

Preferably the sensing means consists of light dependent resistors.

The circuits may include an isolation means such as an opto-isolator controlled by the output of the switching device, with the opto-isolator controlling a power circuit.

Other aspects of this invention which should be considered in all its novel aspects, will become apparent from the following description which is given by way of example only, with reference to the accompanying drawings, in which:

FIG. 1: illustrates a circuit diagram of a prototype of this invention.

The electronic switch can operate from a low voltage and is isolated from a load in the power circuit by suitable isolating means, e.g. an opto-isolator (which typically consists of a light emitting diode LED 11 which is optically coupled to a light activated device, e.g. triac 13).

The opto-isolator allows the triac to conduct when current flows through the LED allowing it to emit light to the triac. In place of an opto-isolator, other isolating means may be used, e.g. a relay.

A switching device in the form of an operational amplifier 10 provides an outut to the LED 11 of the opto-isolator 12, allowing current to flow through the LED when the output from the amplifier goes low.

The output from the amplifier is controlled by the pair of sensing means, in this case light dependent resistors LDR 1 and LDR 2. These resistors, together with resistors R3 and R4 provide a divider, which controls the voltage applied to the amplifier 10.

Resistors R1 and R2 set the mid reference supply voltage to the amplifier, whilst resistors R3 and R4 limit current flow through the LDR's to a safe value. Capacitance C1 is used to filter the incoming supply voltage to remove any 50 hertz or radio frequency signals, picked up by the circuit, e.g. by close positioning of the circuit or its control cables to a motor, or other mains operated device. Capacitance C2 is provided to ensure that the circuit is off when the output of the operational amplifier is high.

Resistor R7 limits the current flow in the LED of the opto-isolator, to a safe value.

Typically, the circuit is sealed within a watertight case or container, having transparent or translucent windows giving access to the light dependent resistors.

The light dependent resistors may be of any suitable type, and typically have dark values at least one thousand times greater than the light value resistance. For example, a suitable LDR has a dark value of 200k ohms, and a light value of 330 ohms.

With these values, a 9 volt supply can be used with resistors R1 and R2 of 10k ohms, and resistors R3 and R4 of 100k ohms, whilst the hysteresis resistors R5 and R6 can also be of 100k ohms.

Thus in use, the electronic switch can be sealed in a case and separated from a load by a long cable 14 designated by breaks 14 in the circuit, with the output of the amplifier set at high when both of the LDRs are exposed to light. When exposed to light, the resistance of the LDRs is low, and thus the input to the operational amplifier is mid-voltage. If LDR1 senses a change in the environment, e.g. by placing a finger or hand over the window allowing light to LDR1, then the resistance will increase to its dark value, and the input to the amplifier will go low, so that the output stays high. LDR1 is used to switch off the opto-isolator. If both windows are covered simultaneously then LDR1 and LDR2 will change from their light values to their dark values with much higher resistance, and no change will be recorded in the amplifier, because input remains at mid-voltage.

However, if the window over LDR2 is covered so that LDR2 senses a change in state, and its resistance increases to the dark value, then the voltage input to the operation amplifier will go high, with the output from the amplifier going low allowing current to flow through the LED of the opto-isolator 12 thereby allowing the triac 13 to conduct and thus switch on the power circuit to the load 15. If the finger or hand is removed from LDR2, and it returns to its light value, the circuit will not be switched because the value of the resistors R5 and R6 is such that the circuit is provided with sufficient hysteresis to prevent equally applied changes in light level from effecting the switch action. Similarly, small changes in light level, e.g. by clouds, obscuring the sun, will not be sufficient to switch the amplifier.

Thus it will be appreciated that the circuit provides a simple and convenient means to control a power circuit, with the circuitry isolated from the environment, and operated by obscuring light to LDR2 to switch the power circuit on, and obscuring the light to LDR1 to switch the circuit off.

In the prototype, the circuit requires about 10 to 20 milli-amps, at 9 volts to drive the LED, and thus it is generally convenient to provide the power supply to the switch circuit by means of a transformer.

The prototype circuit using LDR's has significant advantages over capacities switches and the like, and may be used with ambient light, or with an associated light source used to illuminate the instrument panel which can be marked to indicate the on and off switch windows. Additional LEDs may be used to indicate whether the circuit is in on or off state. An opaque slide may be used to cover the windows.

In addition to switching in damp environments, e.g. spa pool controllers, outdoor lighting, the switch has application to vandal resistant light switches (as it can be encased in an impact resistant clear panel). It could also be used as an alarm sensor by mounting the sensors apart from one another in a normally lit area they would trigger an alarm when one was covered, e.g. by a person's foot.

It can also be used in place of existing capacitive switches, e.g. for lift controls, or in place of membrane or other switches for games, keyboards, and the like.

Finally, it will be appreciated that various alterations or modifications may be made to the foregoing without departing from the spirit or scope of this invention, as exemplified by the following claims.

I claim:

1. An electronic switch, including:

a potential divider;

isolating means capable of switching a separate circuit;

hysteresis means;

light dependent resistors each having a dark value of resistance substantially different from a light value of resistance;

an operational amplifier having an input and an output;

said amplifier input being connected to a mid-point of said potential divider;

said potential divider including a first one of said light dependent resistors on one side of said mid-point and a second one of said light dependent resistors on the other side of said mid-point;

said amplifier output being connected to said isolating means and to said hysteresis means;

wherein a simultaneous change in ambient light level to both said first and said second light dependent resistors will not change the output of said operational amplifier, but a selective change in light level applied to either said first or said second light dependent resistor will cause a corresponding change in the output state of said operational amplifier to either switch "on" or switch "off" the isolating means depending on which resistor receives the change in light level so that the isolating means remains in that state when the selective change in light level is removed until the other of said light dependent resistors is subjected to a change in light level.

2. An electronic switch as claimed in claim 1, wherein said isolating means includes an opto-isolator.

3. An electronic switch as claimed in claim 2, wherein said opto-isolator is remote from said light dependent resistors and said operational amplifier.

4. An electronic switch as claimed in claim 3, wherein the electronic switch is encased in a container and said light dependent resistors are covered by a transparent or translucent window or windows.

5. An electronic switch as claimed in claim 1, wherein the hysteresis means comprises two resistors.

6. An electronic switch as claimed in claim 5, wherein said opto-isolator includes a light-emitting diode which is optically coupled to a triac.

7. An electronic switch as claimed in claim 2, wherein shading one of said light dependent resistors causes the opto-isolator to switch off, and shading of the other of said light dependent resistors causes the opto-isolator to switch on and the state of the system does not change after one light dependent resistor is covered until it is uncovered and the other of said light dependent resistors is covered.

* * * * *